United States Patent [19]

Kear et al.

[11] Patent Number: 5,514,350

[45] Date of Patent: May 7, 1996

[54] APPARATUS FOR MAKING NANOSTRUCTURED CERAMIC POWDERS AND WHISKERS

[75] Inventors: Bernard H. Kear, Whitehouse Station; Weng Chang, Somerset; Ganesh Skandan, Piscataway, all of N.J.; Horst W. Hahn, Darmstadt, Germany

[73] Assignee: Rutgers, The State University of New Jersey, Piscataway, N.J.

[21] Appl. No.: 231,026

[22] Filed: Apr. 22, 1994

[51] Int. Cl.[6] ........................................ F25B 29/00
[52] U.S. Cl. .................. 422/198; 422/210; 422/244; 422/254
[58] Field of Search .................. 422/198, 202, 422/209, 210, 241, 244, 254; 165/65, 91, 94; 264/81, 82, 115

[56] References Cited

U.S. PATENT DOCUMENTS

| | | | |
|---|---|---|---|
| 1,463,216 | 7/1923 | Krase et al. | 422/210 X |
| 1,583,333 | 5/1926 | Bigom | 165/91 |
| 2,001,084 | 5/1935 | Walter | 165/91 |
| 2,118,438 | 5/1938 | Lawrence et al. | 165/91 X |
| 3,024,009 | 3/1962 | Booth, Jr. et al. | 422/244 X |
| 4,014,980 | 3/1977 | Fujimaki et al. | 423/448 |
| 4,900,483 | 2/1990 | Witzke et al. | 264/29.2 |
| 5,128,081 | 7/1992 | Siegel et al. | 264/81 |

OTHER PUBLICATIONS

*Synthesis of Polymerized Preceramic Nanoparticle Powders by Laser Irradiation of Metalorganic Precursors*, P. R. Strutt, K. E. Gonsalves and T. D. Xiao, NanoStructured Materials, vol. 1, pp. 21–25, 1992.
*Ultrafine Oxide Powders Prepared by Inert Gas Evaporation*, B. Günther and A. Kumpmann, NanoStructured Materials, vol. 1, pp. 27–30, 1992.
*Processing and Properties of Nanostructured Wc–Co*, L. E. McCandish, B. H. Kear and B. K. Kim, NanoStructured Materials, vol. 1, pp. 119–124, 1992.
*Mechanosynthesis of Nanophase Materials*, P. Matteazzi, D. Basset and F. Miani, NanoStructured Materials, vol. 2, pp. 217–229, 1993.
*Synthesis of Nanosized Ceramic Nitride Powders by Microwave Supported Plasma Reaction*, NanoStructured Materials, vol. 2, pp. 451–456, 1993.
*Synthesis and Processing of Nanostructured M50 Type Steel*, K. E. Gonsalves, T. D. Xiao, G. M. Chow and C. C. Law, Nanostructured Maaterials, vol. 4, No. 2, pp. 139–147, 1994.
*Laser Synthesis of Nanometric Silica Powders*, M. Luce, N. Herlin, E. Musset and M. Chauchetier, NanoStructured Materials, vol. 4, No. 4, pp. 403–408, 1994.

*Primary Examiner*—Robert J. Warden
*Assistant Examiner*—Robert Carpenter
*Attorney, Agent, or Firm*—Wood, Herron & Evans

[57] ABSTRACT

An apparatus of forming non-agglomerated nanostructured ceramic (n-ceramic) powders from metalorganic precursors combines rapid thermal decomposition of a precursor/carrier gas stream in a hot tubular reactor with rapid condensation of the product particles on a cold substrate under a reduced inert gas pressure of 1–50 mbar. A wide variety of metalorganic precursors is available. The apparatus is particularly suitable for formation of n-$SiC_xN_y$ powders from hexamethyl-disilizane or the formation of n-$ZrO_xC_y$ powders from zirconium tertiary butoxide. The n-$SiC_xN_y$ compounds can be further reacted to form SiC or $Si_3N_4$ whiskers, individually or in random-weave form, by heating in a hydrogen or ammonia atmosphere. The non-agglomerated n-ceramic powders form uniformly dense powder compacts by cold pressing which can be sintered to theoretical density at temperatures as low as 0.5 Tm. By appropriate choice of precursor compound and carrier gas, this apparatus can be used to produce nanoosized powders of almost any desired material, including metals, intermetallics, semiconductors, superconductors, ferro-electrics, optically active materials and magnetic materials, as well as their composites.

7 Claims, 5 Drawing Sheets

APPARATUS FOR MAKING NANOSTRUCTURED CERAMIC POWDERS AND WHISKERS

BACKGROUND OF THE INVENTION

Various physical, chemical and mechanical methods have been devised for the synthesis of nanostructured powders (n-powders). These have been described in detail in the scientific literature (see "NanoStructured Materials," Vols. I, II and III, 1992–4). Of particular relevance to this invention is the prior art on the synthesis of n-powders by (1) thermal decomposition of metalorganic precursors using a focused laser beam, combustion flame or plasma torch as heat source, and (2) evaporation and condensation of volatile species in a reduced-pressure environment.

In the laser synthesis method, n-ceramic powders are produced by passing a precursor/carrier gas stream through a plasma generated by the interaction of a high power density focused laser beam with the gas stream. During the very short residence time of the precursor compound in the plasma, ultrafine clusters or nanoparticles are formed which are carried away by the exhaust gases to be collected in a filter system. Typically, the powders are monodispersed (mean particle size<20 nm), loosely agglomerated, and readily sinterable to theoretical density by conventional hot pressing methods. The resulting sintered materials display excellent properties because of their high purity and ultrafine structures. The process is capable of producing a variety of n-ceramic powders on the laboratory scale, but does not appear to be suitable for the industrial-scale production of such powders.

In the combustion flame and plasma torch synthesis methods, n-ceramic powders are produced by direct injection of the precursor/carrier gas stream into the flame or plasma under ambient pressure conditions. An important difference in the two processes is the use of an oxidizing or reducing atmosphere in the flame process, and an inert or reactive gas atmosphere in the plasma process. The flame process has been applied successfully to the production of commercial quantities of carbon black, $TiO_2$ and $SiO_2$. The plasma process has been used to produce experimental quantities of non-oxide ceramics, including metal carbides, nitrides and borides, such as TiC, TiN and $TiB_2$, as well as their refractory metal equivalents. The simplicity of these two processes more than compensates for the relatively high cost of the precursor chemicals, such as $TiCl_4$ for the production of $TiO_2$ by the flame process, or TiC and $TiB_2$ by the plasma process. For the case of carbon black synthesis, this is not an issue because the carbon source gas is $CH_4$ or natural gas.

A feature of both synthesis methods is the highly agglomerated state of the as-synthesized n-ceramic powders. For example, in the flame synthesis of $TiO_2$, the primary powder particles can vary in size from 5–100 nm, but form cemented aggregates with from 10–1000 nanoparticles per aggregate. While for many applications the agglomeration of the n-ceramic powders is of little consequence, there are situations where it is a shortcoming. An example is in the fabrication of monolithic ceramic shapes for structural applications, where the presence of residual porosity in the sintered material seriously limits performance. It is known that the porosity is due to the bridging of agglomerates in the powder compacts prior to sintering.

In 1985, a potential solution to the nanoparticle agglomeration problem came with the introduction of the Inert Gas Condensation (IGC) synthesis method. In this process, an evaporative source is used to generate the nanophase particles and these are convectively transported to and collected on a cold substrate. An essential feature of the process is a reduced-pressure environment of inert gas, such as He, which must be maintained in the optimal range of 1–10 mbar for the efficient production of non-agglomerated n-particles. The particles are formed in a region just above the evaporative source by interactions between the hot evaporative species and the cold inert He gas atoms in the reaction chamber. Experimental quantities of high purity non-agglomerated n-powders of many different materials have been synthesized by the IGC process, and in several cases full densification of powders has been achieved by solid state sintering of powder compacts at temperatures as low as 0.5 Tm.

The challenge of scaling-up the process is now being addressed, using a forced convective flow system for continuous processing of powders, and a multi-kilowatt electron beam for achieving high evaporation rates. However, many useful ceramics and low vapor pressure metals cannot easily be produced by such an evaporation method, so some other approach is needed.

SUMMARY OF THE INVENTION

The present invention is a new chemical synthetic process for the production of non-agglomerated nanostructured ceramic (n-ceramic) powders starting from metalorganic precursors.

The present invention is based on the realization that rapid thermal decomposition of a precursor/carrier gas stream in a hot tubular reactor combined with rapid condensation of the product particle species on a cold substrate provides such n-ceramic powders. The present invention is further based on the realization that this novel Chemical Vapor Condensation (CVC) process can be optimized by providing a low concentration of precursor compound in the carrier gas, combined with rapid expansion of the gas stream through a uniformly heated tubular reactor under a reduced inert gas pressure, i.e., about 1–50 mbar with rapid quenching of the gas phase nucleated clusters or nanoparticles as they exit the reactor tube.

The present invention is useful for a wide variety of metalorganic precursors, all of which can be utilized in the CVC process of the present invention to produce n-ceramic powders, including single-phase, multi-phase and multi-component systems.

The non-agglomerated n-ceramic powders formed according to the method of the present invention can be used to form uniformly dense powder compacts by cold pressing which can be sintered to near theoretical density at temperatures as low as 0.5 Tm. By appropriate choice of precursor compound and carrier gas, the CVC process may be used to produce powders of almost any desired material, including metals, intermetallics, semi-conductors, superconductors, ferroelectrics, optically active materials and magnetic materials, as well as their composites.

The objects and advantages of the present invention will be further appreciated in light of the following detailed description and drawings in which:

DETAILED DESCRIPTION

Figure 1:
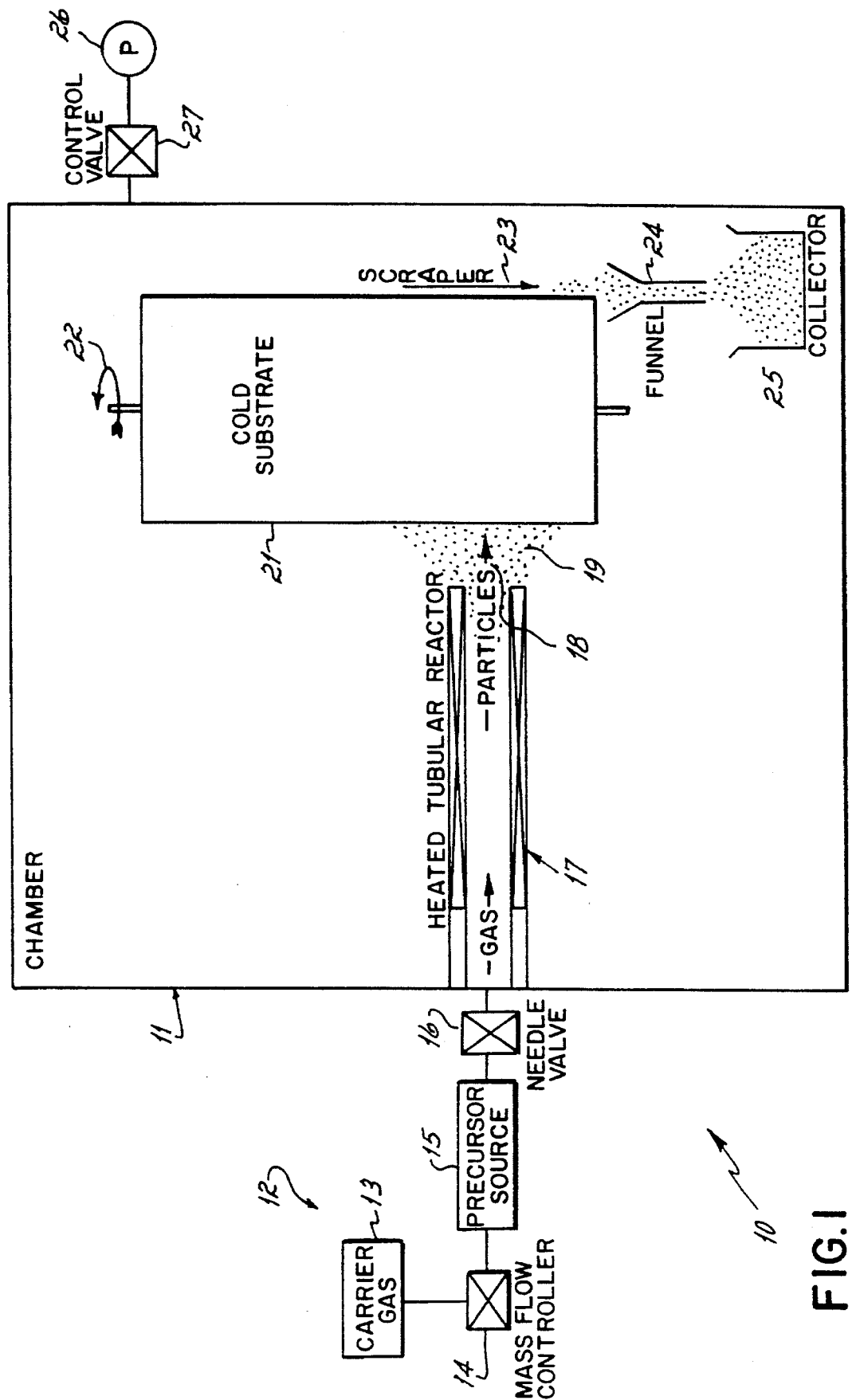
FIG. 1 is a schematic view of an apparatus for use in the present invention.

The reactor for use in the present invention is shown more particularly in FIG. 1. This reactor 10 includes a sealed reaction chamber 11 which is fed with reactants from a precursor delivery system 12. The precursor delivery system 12 includes a source of carrier gas 13 which would, for example, be a pressurized tank of gas which is directed to a mass flow controller 14 which, in turn, combines with a precursor source 15 and is injected into the reaction chamber 11 through needle valve 16.

The needle valve 16 directs the combination of carrier gas and precursor compound directly into a heated tubular reactor 17. The heated tubular reaction is a molybdenum wound furnace tube of high purity alumina or quartz which provides a heat source for controlled thermo-chemical decomposition of the inlet gas stream. This furnace is capable of heating the gas stream from an ambient temperature to a temperature up to about 1400° C. as the gas flows through the heated tubular reactor in a period of about 0.1 second.

The gas flows in the direction shown by arrow 18 through the tubular reactor forming reaction product particles shown as 19. The tubular reactor has an open end directed at a refrigerated surface.

In the embodiment shown in FIG. 1, the refrigerated surface is a cylinder 21 which is rotated in the direction shown by arrow 22. A scraper 23 opposite the tubular reactor separates particles formed on substrate 21, causing them to fall downwardly where they are gathered by a funnel 24 directing them to a collection compartment 25, all within the reaction chamber 11. The internal pressure of this reaction chamber 11 is controlled by a vacuum pump 26 connected to the reaction chamber through a control valve 27 which permits the internal pressure of the reaction chamber to be controlled.

The reactor of the present invention incorporates a mixing chamber 15 which enables the carrier gas and the precursor source to be combined in any desired ratio. In this particular embodiment, the carrier gas is simply bubbled through the liquid precursor source, This will cause a small portion of precursor vapor to mix with the gas. The particular needle valve assures controlled rate of delivery of the precursor carrier gas stream to the heated tubular reactor.

Preferably, the chilled surface 21 is refrigerated and maintained at a temperature effective to cause the vapor to condense. Generally, this will be less than about 0° C. This is accomplished by circulating liquid nitrogen through the cylinder.

This reactor is used to form n-ceramics according to the present invention. In this process, a variety of different carrier gases and precursors can be employed to provide a variety of different nanosized particles. The carrier gas can be, for example any inert gas such as a noble gas—preferably helium or argon. Nitrogen can also be employed,
as well as more reactive gases such as ammonia or hydrogen. Other suitable gases would include methane, ethylene, nitrous oxide, oxygen, carbon monoxide and carbon dioxide.

The precursor source can be any metalorganic compound which can be evaporated to form a gaseous phase in the carrier gas. These include all organometallic compounds used in current CVD processes. Suitable metalorganic compounds include, for example, aluminum, zirconium, yttrium, nickel, titanium, silicon, molybdenum and tungsten silazenes, butoxides, acetyl acetonates, isopropoxides, alkoxides and other metalorganics available commercially.

Synthesis of non-agglomerated n-ceramic powders by the CVC method of the present invention relies on several factors to optimize results. These include a low precursor concentration in the carrier gas, which minimizes the collision frequency between the clusters formed during the short residence time in the heated tubular reactor. Thus the precursor concentration can be increased until agglomeration begins to occur. Generally, the precursor concentration should be less than 20 mole percent, more preferably less than 10 mole percent, which can be reduced to 0.1 mole percent or less to reduce agglomeration.

A second important feature is the rapid expansion of the gas stream into a reduced pressure environment in the reaction chamber. Accordingly, the reaction chamber is generally maintained from about 1 to about 50 mbar.

Finally, rapid cooling of the particles as they exit the reactor, together with a short flight time before the particles are quenched on a liquid nitrogen-cooled cylinder, facilitates rapid formation of non-agglomerated particles. Generally, the reaction chamber will be within 1–3 inches from the refrigerated surface. Further, the refrigerated surface is rotated, providing a clean surface for the formed particles, avoiding collisions and agglomeration.

Along with this feature, the use of a rotating chiller of large diameter relative to the size of the reactor tube makes for high efficiency of nanoparticle collection and a constant quench rate. It should be noted that a scraper on the back side of the rotating substrate ensures continuous removal of deposited powder, thereby providing a clean metallic surface for continuous deposition of particles at a constant quench rate.

Another attractive feature of this process, which is not shown, is the use of a high vacuum chamber for not only the synthesis and collection of the powders, but also for in situ powder consolidation by cold or hot pressing. Thus a hot or cold press can be attached to the high vacuum chamber of reactor 10. Such an arrangement would guaranty no contamination of the high surface area powders, and would permit one to take full advantage of the superior sinterability of clean nanoparticles of the very highest purity. In situ hot consolidation of n- powder compacts without inducing significant grain coarsening should provide materials that display superior mechanical properties.

The reactor, of course, can be modified in many other ways and still fall within the scope of the present invention.

In order to synthesize multi-component n-ceramic powders, multiple injection ports can be employed using either multiple needle valves or combining precursors upstream of the needle valve immediately prior to injection. Further, these can take advantage of available multi-source gas distribution systems previously developed for conventional MOCVD reactors. These systems will deliver separately controlled precursor oxide gas mixtures to different injector guns to synthesize, for example, yttria-stabilized zirconia, or barium strontium titanate powders. To further simplify the gas delivery system, one can also employ an aerosol/vaporizer precursor injector system to make use of organic liquid solutions of all necessary precursor compounds in the correct atomic ratios required to synthesize specific multi-component oxide phases, such as high $T_c$ superconductor phases.

EXAMPLE 1

In a series of four experiments, the furnace temperature was varied over the range 1100°–1400° C. in 100° C. steps, the flow rate of He carrier gas was fixed at $8.55 \times 10^{-3}$ mole/min, the HMDS concentration in the He-carrier gas was set at 16.5 mole %, the leak rate was fixed to give a dynamic pressure of 10 mbar in the reaction chamber, and the stand-off distance of the cold substrate from the reactor tube exit was set at 5 cm. In all four tests, about 2 grams of powder was collected after about 30 minutes operation of the reactor. The reaction conditions are shown in Table 1. The different powder deposits produced varied in color from brown to black, which correlated with increasing pyrolysis temperature, Table 2. X-ray diffraction analysis showed that all powders were amorphous. Electron microprobe and Rutherford back-scattering analyses revealed that the amorphous powders had variable compositions of the type $SiC_xN_yO_z$ (wherein x generally represents 1 to about 1.6, y represents 0 to about 0.5 and z represents 0 to about 0.7), Table 3. The presence of carbon and nitrogen in the particles simply reflects the composition of the initial HMDS precursor. The oxygen is a contaminant, picked up when the high surface area powder is exposed to air. The average particle size from TEM ranged from 6–10 nm, with the smallest particle size corresponding to the highest reaction temperature. In contrast, the measured particle size by BET increased with the reaction temperature over the range 4–8 nm. This suggests that the particles determined by TEM—at least at the lower reaction temperatures—are, in fact, composed of partially agglomerated clusters in each nanoparticle. Even by careful examination at high resolution, it was not possible to resolve the clusters in the 10 nm particles because of the low contrast of their amorphous structures.

TABLE 1

| Sample Name | S-1 | S-2 | S-3 | S-4 |
| --- | --- | --- | --- | --- |
| Reactor Temperature (°C.) | 1100 | 1200 | 1300 | 1400 |
| Carrier Gas | He | He | He | He |
| Flow Rate ($10^{-3}$) mole/min | 8.55 | 8.55 | 8.55 | 8.55 |
| HMDS Concentration in gas mixture (mole %) | 16.5 | 16.5 | 16.5 | 16.5 |
| Residence time(s) | 0.072 | 0.067 | 0.063 | 0.058 |
| Conversion Efficiency (%) | 30 | 44 | 45 | 51 |

Table 1 presents a summary of the CVC processing conditions used to prepare four experimental batches of amorphous $n\text{-}SiC_xN_y$ powders. The tubular reactor temperature was incremented in 100° C. steps over the range 1100°–1400°, the flow rate of He carrier gas was fixed at $8.55 \times 10^{-3}$ mole/min, the HMDS precursor concentration was set at 16.5 mole %, the chamber pressure was fixed at 10 mbar, and the stand-off distance of the cold substrate from the exit of the hot tubular reactor was set at 5 cm.

TABLE 2

| Sample Name | S-1 | S-2 | S-3 | S-4 |
| --- | --- | --- | --- | --- |
| Reactor Temperature (°C.) | 1100 | 1200 | 1300 | 1400 |
| Powder Density (g/cm³) | 2.614 | 2.737 | 2.781 | 2.783 |
| Powder Appearance | brown | dark brown | brown-black | jet black |
| Surface area** (m²/g) | 568 | 555 | 360 | 320 |
| Particle size from BET (nm) | 4 | 4 | 6 | 6.7 |
| Particle size from TEM (nm) | 10 | 10 | 8 | 6 |

*Measured by pycnometry using He gas.
**Measured by single point BET adsorption.

Table 2 compares some important characteristics of the four batches of as-synthesized $SiC_xN_y$ powders. With increasing pyrolysis temperature, the powder appearance changes from brown to black, the powder density increases, and the powder particle size (by TEM) decreases. The smaller particle sizes deduced from BET adsorption measurements at the lowest reaction temperatures reflect some agglomeration of exceptionally high surface area clusters.

TABLE 3

| | | $SiC_xN_yO_z$ | | |
| --- | --- | --- | --- | --- |
| Name | Condition | X | Y | Z |
| HMDS | As-received precursor | 3.00 | 0.50 | 0.00 |
| | Reactor temperature (C.) | | | |
| S-1 | 1100 | 1.26 | 0.35 | 0.61 |
| S-2 | 1200 | 1.35 | 0.40 | 0.47 |
| S-3 | 1300 | 1.45 | 0.48 | 0.29 |
| S-4 | 1400 | 1.51 | 0.49 | 0.28 |
| | Annealing temperature (C.) | | | |
| A-1 | 1600 | 1.00 | 0.00 | 0.00 |

Table 3 compares chemical compositions of the four batches of as-synthesized amorphous $n\text{-}SiC_xN_yO_z$ powders, as determined by Rutherford backscattering spectroscopy. The presence of carbon and nitrogen in the particles reflects the initial composition ($SiC_3N_{0.5}$) of the HMDS precursor, after some loss of constituents during pyrolysis. The oxygen is a contaminant, picked up when the high surface area powder is exposed to air. Heat treating these amorphous n-powders in argon at 1600° C. for 4 hours in argon causes crystallization into phase pure cubic a-SiC.

Surface area measurements on the four batches of $n\text{-}SiC_xN_y$ powders, as determined by single point nitrogen adsorption, gave values ranging from 568–272 m²/g with increasing pyrolysis temperature. This is consistent with the formation at the lowest synthesis temperatures of nanoparticles that are composed of cemented aggregates of very high surface area clusters. The densities of the nanoparticles were determined by He-pycnometry to be $\leq 2.6$ g/cm³. As indicated, the density of the particles increases with reaction temperature, which probably reflects the higher degree of precursor pyrolysis, i.e., conversion of the HMDS precursor to $SiC_xN_y$ phase. At even lower reaction temperatures, the as-synthesized particles have a wax-like consistency, which is consistent with the formation of an inorganic polymer.

All the $n\text{-}SiC_xN_y$ powders could be ultrasonically dispersed in methyl alcohol, forming an apparently stable colloid with no visible evidence for sedimentation after several days, indicating that there is little or no agglomeration of the nanoparticles in the as-synthesized powders. Relatively large concentrations (up to 20 wt %) of the nanoparticles could be dispersed in solution to give a mixture with a paste-like consistency. Using a dilute colloidal solution, a carbon-coated grid was used to extract a small sample of powder for TEM examination. Typically, the nanoparticles formed chains or flat islands on the supporting film when the solvent evaporated. Electron micrographic observation showed chains of particles with average size 10 nm, with no evidence for "neck" formation between adjacent nanoparticles. This is direct evidence for the absence of significant particle agglomeration, i.e., formation of cemented particle aggregates, in the as-synthesized n-ceramic powders produced by the CVC process.

EXAMPLE 2

In addition to the investigation of the synthesis of n-$SiC_xN_y$ powder from HMDS/He, we also examined the effect of changing the carrier gas, particularly on the chemistry of the as-synthesized powders. Using $NH_3$ as carrier gas, the resulting powder is nearly phase pure n-$Si_3N_4$. On the other hand, with $H_2$ as carrier gas, the carbon content of the as-synthesized n-$SiC_xN_y$ powder is drastically reduced, at least when compared with the HMDS/He-derived powder.

EXAMPLE 3

Using zirconium tertiary-butoxide as precursor compound and He as carrier gas, we have synthesized amorphous n-$ZrO_xC_y$ powder, with mean particle size <10 nm. It is believed that the amorphous nature of the powder is a consequence of residual volatile species trapped in the particles. The powder synthesized at a reactor temperature of 500° C. has more polymeric species in it than the powder synthesized at a reactor temperature of 700° C. This is borne out by the fact that the former loses more weight on annealing than the latter.

EXAMPLE 4

Figure 2:
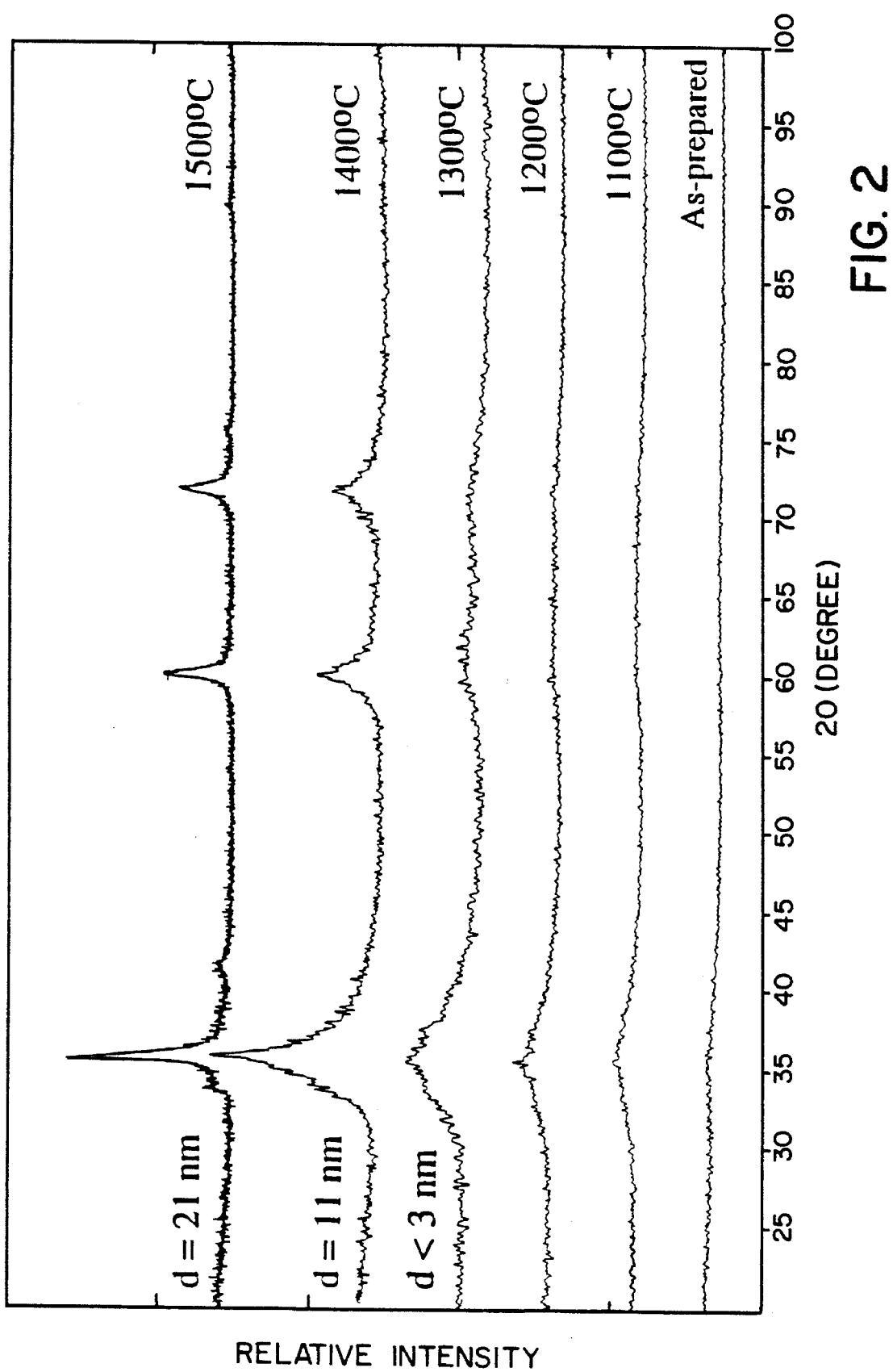
FIG. 2 is an x-ray diffraction pattern of n-$SiC_xN_y$.
Figure 3:
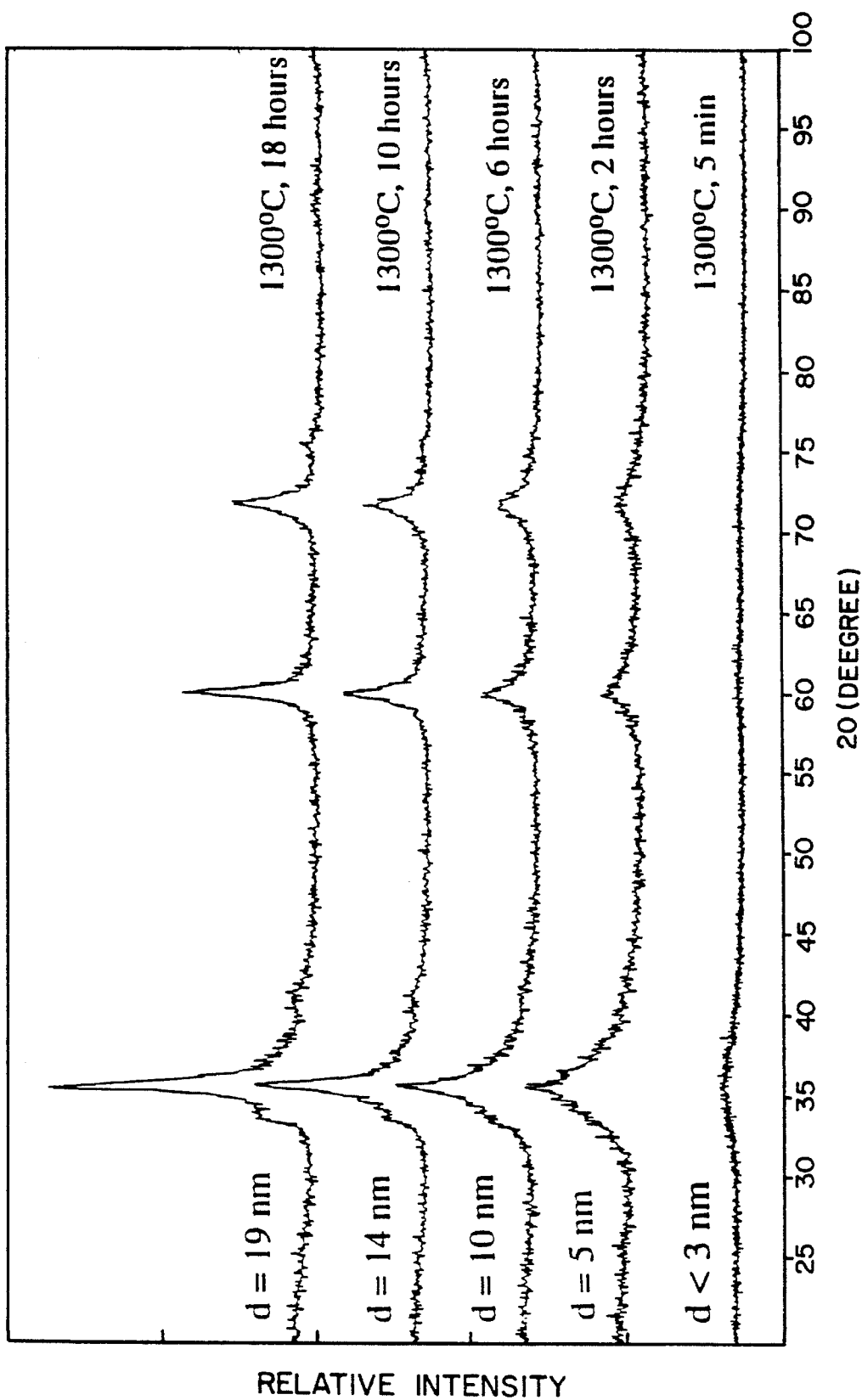
FIG. 3 is an x-ray diffraction pattern of n-SiC$_x$N$_y$ powders after heat treatment in flowing argon at 1300° C. for up to 18 hours.

FIG. 2 shows the effect of heat treating amorphous n-$SiC_xN_y$ powder in flowing argon at temperatures in the range 1100°–1500° C. for 5 minutes. Crystallization into cubic $SiC_xN_y$ commences at 1200°–1300° C. and is complete at 1400° C. The average grain size of the crystallized powder product is 3 nm at 1300° C., as determined from the x-ray line broadening, which is smaller than the 10 nm particle size estimated from direct observation by TEM. It is believed that the presence of free carbon in the crystallized powder inhibits grain growth so that each nanoparticle contains several grains, at least initially. After heat treating at 1300° C. for <10 hours, FIG. 3, the average grain size becomes comparable with the particle size, which is interpreted to mean that any residual carbon has segregated to the nanoparticle surfaces. When the powder is heat treated at 1600° C. for 4 hours in argon, the cubic SiC powder becomes phase pure, Table 3. The disappearance of the free carbon in the powder can be attributed partly to reaction with the oxygen contaminant on the powder surfaces, and partly to reaction with trace oxygen impurities in the flowing argon.

EXAMPLE 5

Figure 4:
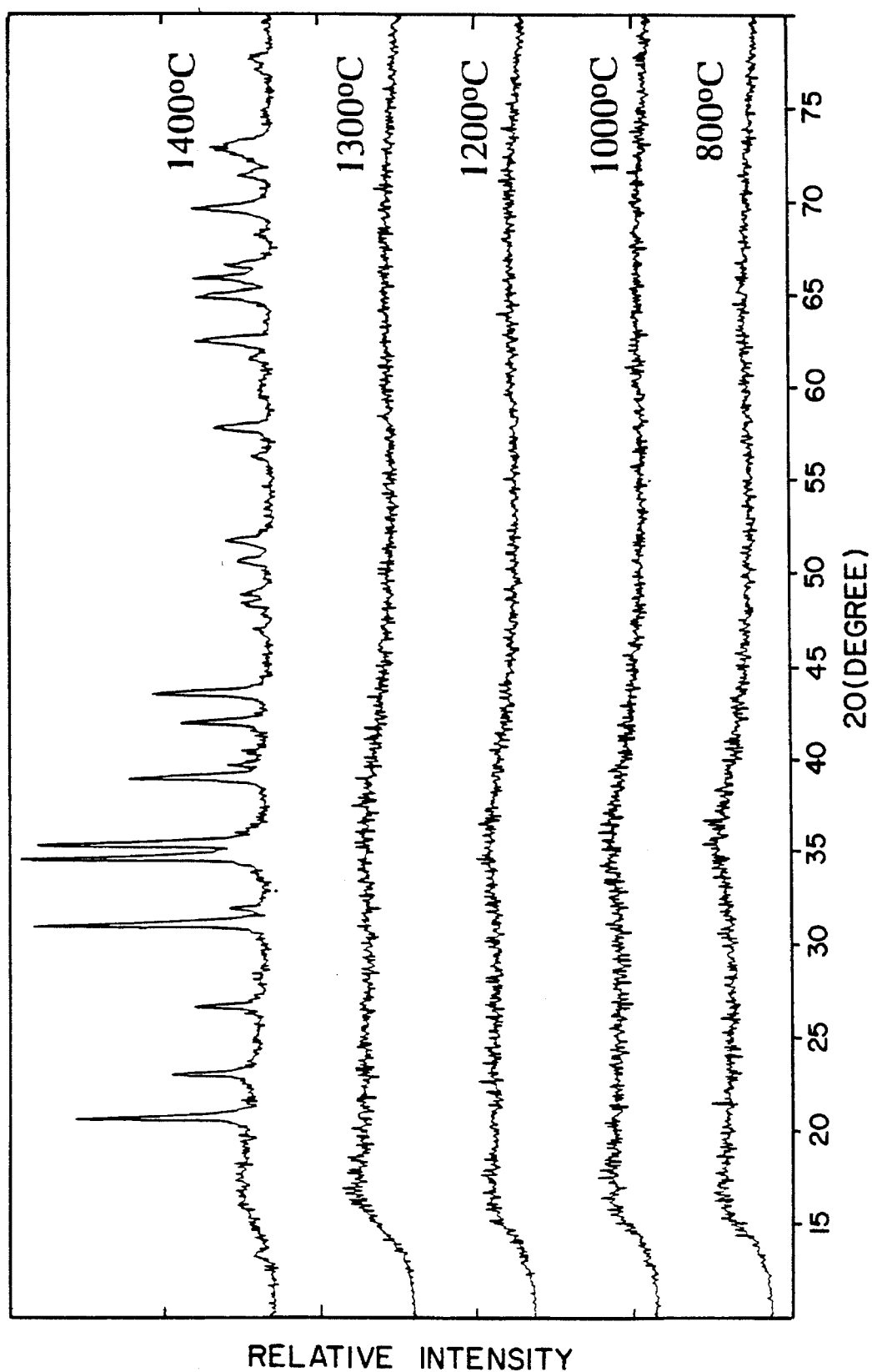
FIG. 4 is an x-ray diffraction pattern of n-SiC$_x$N$_y$ powders after heat treatment in flowing NH$_3$/H$_2$ (1:1 mixture) at temperatures in the range of 800°–1400° C. for 5 minutes.

FIG. 4 shows the effect of heat treating amorphous n-$SiC_xN_y$ powder in flowing $NH_3/H_2$ (1:1 mixture) at temperatures in the range 800°–1400° C. for 5 min. Crystallization into hexagonal $Si_3N_4$ occurs at 1400° C. Surprisingly, the a-$Si_3N_4$ is in the form of nanowhiskers, with diameters of 30–60 nm and aspect ratios as high as 500:1, which display a high degree of single crystal perfection. Ultrafine droplets of liquid silicon are formed by reductive decomposition of n-$SiC_xN_y$ particles in the powder bed, and it is these droplets that are believed to be responsible for the growth of single crystal $Si_3N_4$ nanowhiskers. Apparently, the liquid silicon droplets migrate through the powder bed, dissolving amorphous nanoparticles in their path and leaving crystalline whiskers in their wake. Coalescence of liquid silicon droplets formed in a powder agglomerate can also give rise to larger silicon droplets which, in turn, can generate larger-diameter whiskers.

As shown in Table 4, there is a systematic change in the composition of the as-synthesized powder with increasing heat treatment temperature. At 1400° C., a sharp reduction in oxygen content and a corresponding enrichment in nitrogen occurs, which probably exerts an important influence on whisker formation at this temperature.

TABLE 4

| Sample Names | Annealing Temperature (C.) | $SiC_xN_yO_z$ | | |
|---|---|---|---|---|
| | | X | Y | Z |
| NH-1 | 400 | 1.86 | 0.46 | 0.25 |
| NH-2 | 800 | 1.53 | 0.57 | 0.23 |
| NH-3 | 900 | 1.23 | 0.77 | 0.33 |
| NH-4 | 1000 | 0.91 | 0.69 | 0.53 |
| NH-5 | 1200 | 0.97 | 0.82 | 0.24 |
| NH-6 | 1400 | 0.73 | 1.22 | 0.09 |

Table 4 compares chemical compositions of as-synthesized (1400° C. reactor temperature) n-$SiC_xN_y$ powder after heat treatment in flowing $NH_3/H_2$ (1:1 mixture) at temperatures in the range 300°–1400° C. for 5 minutes. With increasing temperature, the nitrogen content increases and the carbon content decreases due to chemical reactions with the nitrogen/hydrogen-rich gas stream. At 1400° C., a sharp reduction in the oxygen content of the powder occurs which correlates with the formation of hexagonal $Si_3N_4$ nanowhiskers.

EXAMPLE 6

Figure 5:
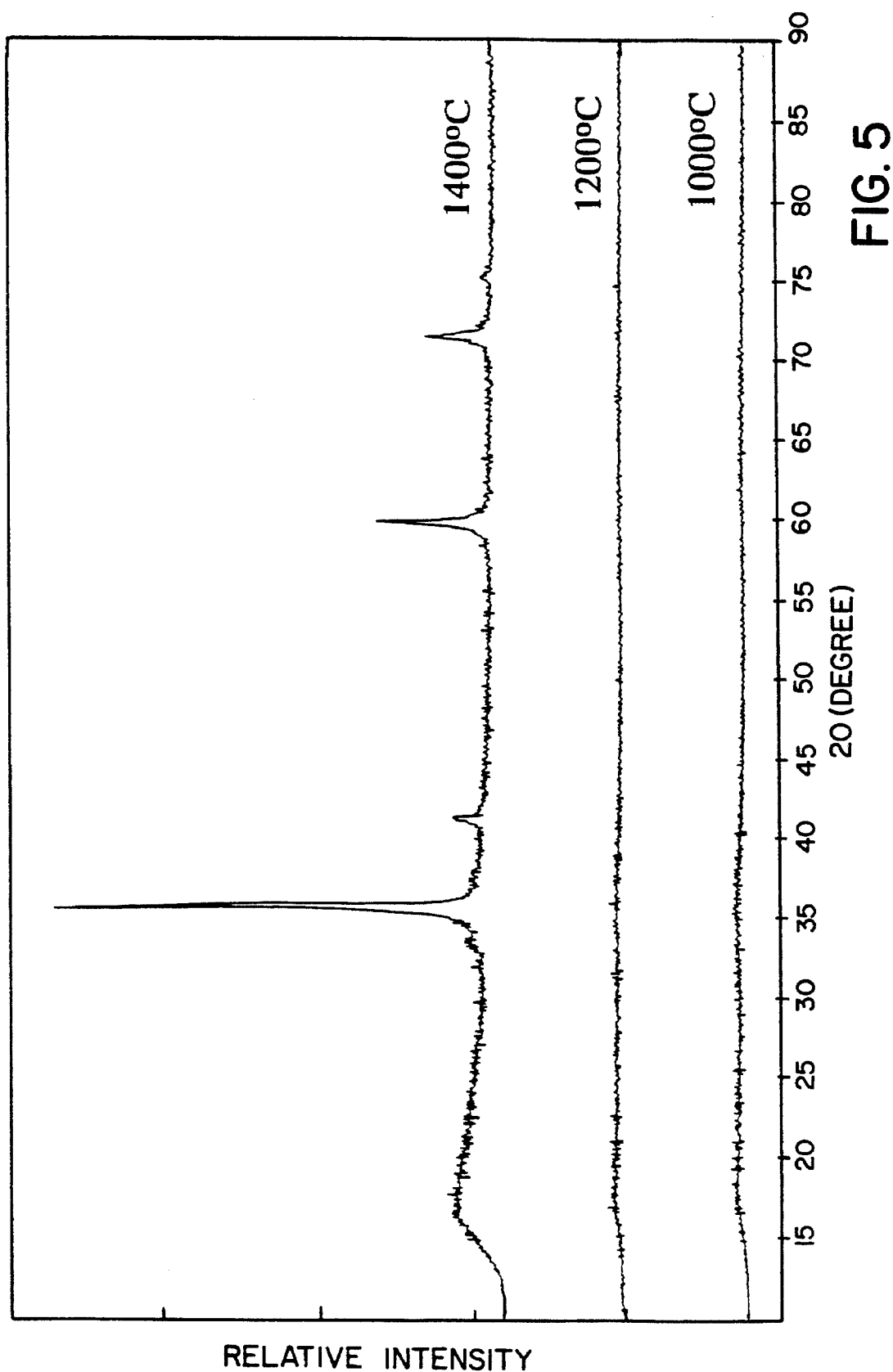
FIG. 5 is an x-ray diffraction pattern of n-SiC$_x$N$_y$ powders after heat treatment in flowing hydrogen at temperatures in the range of 1000°–1400° C. for 5 minutes.

FIG. 5 shows the effect of heat treating amorphous n-$SiC_xN_y$ powder in flowing $H_2$ at temperatures in the range 1000°–1400° C. for 5 min. Crystallization into single crystal nanowhiskers (20–50 nm diameter) of cubic b-SiC occurs at 1400° C. By TEM, it was established that the whiskers had a [111] growth direction, and there were many (111) stacking faults oriented perpendicular to the growth axis.

In all cases, there was an obvious tendency for the nanocrystalline whiskers to form interpenetrating networks, which replicated the original shape of the powder samples. In order to perform a more definitive test of this behavior, a powder sample was spread out uniformly on the bottom of a high purity alumina crucible (0.25 in.×0.5 in.×3.0 in.) and then subjected to heat treatment at 1200° C. in hydrogen for 10 hours. The resulting free-standing whisker pre-form, which had the same shape as the crucible from which it was removed, was composed of a low density (<10 volume %) of cubic SiC whiskers. Interestingly, the whisker pre-form was quite flexible, and could be bent and compressed to some degree without losing the ability to recover its original shape when unloaded. SEM observation showed many severely bent whiskers in the woven structure, indicating that they possess inherently high strength and stiffness, which is to be expected of single crystal SiC whiskers.

EXAMPLE 7

Powder compacts of n-ZrO$_2$, with an average particle size of 6 nm, were air sintered at 1135° C. for 40 minutes, and the average grain size was less than 100 nm. Similar powder compacts were vacuum sintered at 975° C. for 40 minutes, and the average grain size was 60 nm. Sinter forging and hot pressing were also used to further reduce the densification temperature, and hence the grain size. Grain sizes as small as 35 and 45 nm, respectively, were obtained in the sinter forced and hot pressed conditions. Contrary to conventional wisdom in the field, the stresses needed to densify n-ZrO$_2$ powders are much lower in sinter forging than in hot pressing. The applied stresses required to fully densify n-ZrO$_2$ powders at 900° C. are, respectively, 200 MPa and 350 MPa. These results are summarized in Table 5.

As noted in Example 3, the n-ZrO$_x$C$_y$ powder synthesized at a reactor temperature of 500° C. had more residual polymeric species in it than the powder synthesized at a reactor temperature of 700° C. Similar characteristics are displayed by powders of n-SiC$_x$N$_y$ synthesized at temperatures below about 900° C. The organic by-products remaining after partial pyrolysis of the precursor compound can serve as an effective lubricant, improving the compatibility and formability of green compacts. Thus, there is now a way of adding the amount of lubricant needed in the powder by controlling the decomposition kinetics of the precursor compound, i.e., by appropriate adjustments of reactor temperature and gas residence time.

TABLE 5

| Sintering Technique | Sintering Temperature (C.) | Sintered Density | Grain Size (nm) |
|---|---|---|---|
| Air Sintering | 1135 | >99.9% | <100 |
| Vacuum sintering | 975 | >99.9% | 60 |
| Air sinter-forging | 950 | 98.5% | 45 |
| Vacuum sinter-forging | 900 | >98.5% | 35 |
| Hot-pressing | 900 | >98.5% | 45 |

Table 5 compares data on the sinterability of n-ZrO$_2$ powder compacts using different sintering methods. The lowest sintering temperatures, corresponding with the smallest grain sizes in the fully sintered products, are realized by sinter forging and hot pressing.

Thus, the present invention provides a method of forming a wide variety of n-ceramic powders from metalorganic precursors. These powders can be used as catalysts for promoting chemical reactions, as functional additives in paints and plastics, and as feedstocks in the fabrication of porous or dense structures. For example, uniform nanoporous structures formed by partial sintering of n-ceramic powder compacts have potential utility as biological filters, as battery electrodes, and for chemicals separations. On the other hand, fully dense n-ceramic coatings and parts, which should possess superior high temperature strength, hot corrosion resistance and fracture toughness, have potential applications in gas turbine engines, rocket engines, adiabatic diesel engines and conventional internal combustion engines.

As-synthesized n-ceramic powders can also be further treated to form woven networks of crystalline n-ceramic whiskers. Such self-assembled woven structures, which are both flexible and resilient, have potential utility as wrap-around insulator tapes or tiles, such as used for thermal insulation purposes in the space shuttle. Extraordinary opportunities also exist for the net-shape fabrication of a new generation of high performance whisker-reinforced nanocomposites by matrix infiltration of whisker pre-forms. The use of n-ceramic powders as infiltrants in the fabrication of ceramic matrix composites is particularly advantageous since (1) pressure infiltration of an n-ceramic slurry into a woven ceramic pre-form has the capacity to fill all the available pore space in that pre-form, thus ensuring a defect-free sintered product, and (2) the low sintering temperatures characteristic of n-ceramic powder compacts (example 7 above) should suppress harmful whisker/matrix interfacial reactions—an ubiquitous problem encountered in composite fabrication. Current research is directed towards the net-shape fabrication of polymer matrix composites (PMCs), metal matrix composites (MMCs), and ceramic matrix composites (CMCs), utilizing a variety of matrix infiltration and densification techniques.

This has been a description of the present invention, along with the preferred method of practicing the present invention.

However, the invention itself should be defined only by the appended claims wherein we claim 1. An apparatus for the synthesis of non-agglomerated nanostructured ceramic powders comprising:

a reaction chamber adapted to withstand a pressure of from about 1 to about 50 mbar;

a source of a carrier gas;

a source of a metalorganic precursor; and a gas delivery system adapted to combine said metalorganic precursor with said carrier gas and further including an injection port leading to an inlet of an elongated, heated reactor within said reaction chamber, said heated reactor effective to cause thermal decomposition of said metalorganic precursor at a temperature of 500° C. to 1400° C., said heated reactor directing reaction products through an outlet against a refrigerated surface, said refrigerated surface being forward of said outlet.

2. The apparatus claimed in claim 1 wherein said refrigerated surface is movable in relation to said heated reactor.

3. The apparatus claimed in claim 2 wherein said refrigerated surface comprises a refrigerated, cylindrical surface rotatable relative to said open end of said heated reactor.

4. The apparatus claimed in claim 3 wherein said cylindrical surface is refrigerated with liquid nitrogen and said apparatus further includes a scraper contacting said cylindrical surface whereby rotation of said cylindrical surface directs said surface from in front of said outlet of said heated reactor around to said scraper.

5. The apparatus claimed in claim 2 wherein said heated tubular reactor has a length of about 6 inches.

6. The apparatus claimed in claim 5 wherein said heated reactor comprises a tubular reactor formed from a material selected from the group consisting of alumina and quartz.

7. The apparatus claimed in claim 6 wherein said heated reactor includes multiple precursor carrier gas inlets.

* * * * *

UNITED STATES PATENT AND TRADEMARK OFFICE
CERTIFICATE OF CORRECTION

PATENT NO. : 5,514,350
DATED : May 7, 1996
INVENTOR(S) : Bernard H. Kear, Weng Chang, Ganesh Skandan, Horst W. Hahn It is certified that error appears in the above-indentified patent and that said Letters Patent is hereby corrected as shown below:

Column 1, after the BACKGROUND OF THE INVENTION INSERT:

--The U.S. Government has a paid-up license in this invention and the right, in limited circumstances, to require the patent owner to license others on reasonable terms, as provided by the terms of Contract No. N00014-91-J-1828, funded by the Office of Naval Research.--

Signed and Sealed this

Thirtieth Day of July, 1996

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,514,350
DATED : May 7, 1996
INVENTOR(S) : Bernard H. Kear, Weng Chang, Ganesh Skandan, Horst W. Hahn It is certified that error appears in the above-indentified patent and that said Letters Patent is hereby corrected as shown below:

In the abstract, line 18:

please delete "nanoosized" and insert in place thereof --nano-sized--.

In the claims, column 10, line 58:

please delete "tubular".

Signed and Sealed this

Tenth Day of September, 1996

Attest:

BRUCE LEHMAN

Attesting Officer    Commissioner of Patents and Trademarks